United States Patent
Nomura et al.

(10) Patent No.: US 8,675,458 B2
(45) Date of Patent: Mar. 18, 2014

(54) CONNECTION STRUCTURE OF FLEXIBLE PRINTED CIRCUITS AND OPTICAL PICKUP DEVICE

(75) Inventors: Rika Nomura, Yokohama (JP); Hiroaki Furuichi, Kawasaki (JP); Eiji Tsubono, Yokohama (JP); Shoji Matsumoto, Kawasaki (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 609 days.

(21) Appl. No.: 12/898,757

(22) Filed: Oct. 6, 2010

(65) Prior Publication Data

US 2011/0158077 A1 Jun. 30, 2011

(30) Foreign Application Priority Data

Dec. 28, 2009 (JP) ................................. 2009-296690

(51) Int. Cl.
*G11B 7/00* (2006.01)
*H05K 1/00* (2006.01)

(52) U.S. Cl.
USPC ........................ 369/44.14; 361/749; 361/803

(58) Field of Classification Search
None
See application file for complete search history.

(56) References Cited

U.S. PATENT DOCUMENTS

| | | | | |
|---|---|---|---|---|
| 4,795,079 A | * | 1/1989 | Yamada | 228/179.1 |
| 5,418,691 A | * | 5/1995 | Tokura | 361/749 |
| 6,966,482 B2 | * | 11/2005 | Totani et al. | 228/215 |
| 2006/0161940 A1 | * | 7/2006 | Arai et al. | 720/685 |
| 2007/0169136 A1 | * | 7/2007 | Hiramatsu et al. | 720/658 |
| 2008/0045077 A1 | * | 2/2008 | Chou | 439/495 |
| 2009/0289885 A1 | * | 11/2009 | Chao | 345/98 |
| 2009/0323503 A1 | * | 12/2009 | Nomura et al. | 369/112.23 |

FOREIGN PATENT DOCUMENTS

| | | | |
|---|---|---|---|
| JP | 55013974 A | * | 1/1980 |
| JP | 62-107478 U | | 7/1987 |
| JP | 63-27072 U | | 2/1988 |
| JP | 63-167780 U | | 11/1988 |
| JP | 2005-276263 | | 10/2005 |
| JP | 2006-245514 | | 9/2006 |
| JP | 2006-310449 | | 11/2006 |

* cited by examiner

*Primary Examiner* — Thang Tran
(74) *Attorney, Agent, or Firm* — Antonelli, Terry, Stout & Kraus, LLP.

(57) ABSTRACT

In connecting flexible printed circuits, a structure with improved connection strength of the connection portion is provided. In this structure in which a first flexible printed circuit and a second flexible printed circuit are connected to each other, a through-hole is provided on the second flexible printed circuit, and a resin member passes through the through-hole and is adhered to the wires of a connection surface of the first flexible printed circuit and the side of the second flexible printed circuit opposite to the connection surface, whereby impact is absorbed by the elasticity of the resin; as for the first flexible printed circuit, adhesion is performed on a metal in a wiring layer with high adhesion strength, while as for the second flexible printed circuit, adhesion is performed on the back side upon which no peeling stress is exerted, improving joining strength to prevent peeling.

15 Claims, 10 Drawing Sheets

PRIOR ART

CONNECTION STRUCTURE OF FLEXIBLE PRINTED CIRCUITS AND OPTICAL PICKUP DEVICE

BACKGROUND OF THE INVENTION

1. Field of the Invention

The present invention relates to an optical pickup device used for reproduction and recording from/into an optical disk such as CD (compact disk), DVD (digital versatile disk), etc., and a connection structure of flexible printed circuits used in optical pickup devices.

2. Description of the Related Art

Conventionally, a thin optical pickup device (having a thickness of at most 7 mm) used for reproduction and recording from/into an optical disk such as CD, DVD, etc., or an optical disk drive device with a thin optical pickup device incorporated therein is structured as shown in FIG. 8. Parts, such as laser diodes, various lenses, mirrors, photodetectors (not shown), etc., which constitute an optical system, are arranged on an optical pickup case 3 formed by means of die casting or molding, of which main components comprise metal such as Zn, Mg, Al, etc. and a PPS (polyphenylene sulfide) resin, and a flexible printed circuit 2 is used as means that supplies an electric signal. Accompanying with thinning of optical disk drive device, connectors cannot be used due to projection limitations. Therefore, the flexible printed circuit 2 is structured into an integral form to extend to a portion 8 thereof, which is inserted into a connector of a drive side.

FIG. 10 shows a state, in which an optical pickup device is assembled into an optical disk drive device. An optical pickup device body 1 has an objective lens 5 facing upwardly and the lens 5 is opposed to an optical disk (not shown) through a notched portion of a cover 9 of the drive. The optical pickup device performs information reading and writing while moving between an outer periphery and an inner periphery of the optical disk. All these parts are assembled into an optical disk drive device body 10 to provide a product.

In this manner, while a flexible printed circuit used in a thin optical pickup is structured in an integral form, portions arranged on an inner side and an outer side of the flexible printed circuit are different from each other in performance required originally, and high density is emphasized on the inner side and flexibility is emphasized on the outer side. Hereupon, means of solution in the flexible printed circuit 2 made into an integral form has been proposed to select a flexible printed circuit, which has optimum performances for high density and flexibility, as a method that meets both performances required of a portion of the flexible printed circuit to be fixed to an optical pickup device and a portion of the flexible printed circuit to be inserted into the connector of the drive.

Meanwhile, various parts cannot but be arranged at a high density in horizontal and vertical directions in a narrow optical pickup device, and therefore, a flexible printed circuit serving as signal transmission is required to assume a complex configuration. This requires a divided structure for a flexible printed circuit in terms of cost since necessary configurations obtained from a single original sheet cannot be increased in number and even a portion, for which a simple structure will do, is influenced by a portion, which takes longest time, because of different necessary processes according to portions.

In the meantime, the optical pickup device shown in FIG. 8, or an optical disk drive device, into which a thin optical pickup device is assembled, is assembled through a plurality of complex processes. Therefore, there often arises a case in which the optical pickup device or the optical disk drive device is deemed as defective products due to dents, defects, etc. generated in the flexible printed circuit during assembling process after a process, in which adjustment is accomplished on a light-emitting element, a photodetector, and various optical parts of the optical pickup device, is performed. By adopting division of a flexible printed circuit into a plural printed circuits and connection of flexible printed circuits, an increase in yield of products and reduction in cost can be realized (see, for example, Japanese Patent Application Laid-Open Publication Nos. 2005-276263 and 2006-245514).

Because of a projection limitation on an optical pickup, a connector proposed in Japanese Patent Application Laid-Open Publication No. 2006-310449 cannot be used for connection of two flexible printed circuits, and so the printed circuits are connected to each other by means of soldering. In case of adopting division of a flexible printed circuit and connection of flexible printed circuits shown in FIG. 9A, when a conductor pattern of a the first flexible printed circuit and a conductor pattern of a second flexible printed circuit are caused to face and overlap each other, the second flexible printed circuit is made to define a back surface and a connector side contact 8 is reversed. Hereupon, as shown in FIG. 9B, the connector side contact 8 is directed upward by connecting the other end of the first flexible printed circuit and the other end of the second flexible printed circuit so as to have them facing and overlapping each other, and bending the connected ends of the flexible printed circuits at 90° in a projection direction (vertical direction) of the optical pickup device, or fixing the connected end of the first flexible printed circuit and bending the connected end of the second flexible printed circuit at 180°.

SUMMARY OF THE INVENTION

With the connection structure shown in FIG. 9B, however, stress is liable to be applied on the connection portions of the first and second flexible printed circuits in a peel direction and a tendency of much decrease in joint strength is shown such that a connection portion 2-*d* in the connected structure shown in FIG. 9B has an average peel strength of at most 1.5 kgf as compared with an average shear strength of 3 kgf in a connection portion 2-*c* in the case where the flexible printed circuits are caused to face and overlap each other as shown in FIG. 9A.

Further, many wires are arranged in a narrow location on a portion of the flexible printed circuit, in which the flexible printed circuit extends out of a cover 4 from the optical pickup device and at which the flexible printed circuit is dividable and the divided printed circuits are connectable with each other, and a grounding wire having a wide wiring width and signal wires having a narrow wiring width are mixed in the portion, but wires having a narrow wiring width tend to be one-sided. Therefore, wires having a narrow wiring width and a wiring pattern width of at most 100 µm are used as outermost wires in many cases, and in case where the division of the flexible printed circuit and connection of flexible printed circuits is employed, a structure of the connected portion becomes such that peeling is liable to occur from an end of the conductor pattern having a narrow wiring width, that is, the outermost conductor pattern.

From the above, a structure readily enabling reinforcement of connection portions is needed when a flexible printed circuit is divided and the divided flexible printed circuits are connected.

It is an object of the present invention to provide a structure of flexible printed circuits readily enabling reinforcement of connection portions in the case where flexible printed circuits are connected with each other.

To achieve the above-mentioned object, the present invention is characterized by a connection structure of a flexible printed circuit comprising a the first flexible printed circuit and the flexible printed circuit which are connected to each other, the first flexible printed circuit having a through-hole provided there in, a resin member passing though the through-hole, and a connection surface of a second flexible printed circuit and a surface of the first flexile printed circuit opposite to the connection surface being adhered.

As described above, when the structure of the invention is adopted, it is possible in the connection portions of the flexible printed circuits in the optical pickup device to achieve an improvement in reliability and durability.

BRIEF DESCRIPTION OF THE DRAWINGS

The present invention will become fully understood from the detailed description given hereinafter and the accompanying drawings, wherein.

DESCRIPTION OF THE PREFERRED EMBODIMENT

An embodiment of the invention will be described below with reference to FIGS. 5 to 7. An optical pickup device 1 comprises various optical parts including an object lens 5, optical modules such as a laser diode and a photodetector, an optical pickup case 3 formed by means of die casting or molding, in which either of a PPS resin and metal such as Zn, Al, Mg, etc. constitutes a main component, a first flexible printed circuit 2-*a* fixed to a body of the optical pickup device with chips mounted on the optical pickup case 3, a second flexible printed circuit 2-*b* to be inserted into a connector on a drive side, and a cover 4 that finally imposes a projection limit. The flexible printed circuits 2-*a*, 2-*b* generally comprise a resin including polyimide and an adhesive, and metal including a copper foil. The technology, according to the invention, of connection of flexible printed circuits is generally applied to a thin optical pickup device but can also be applied to a product other than the thin optical pickup device, in which flexible printed circuits are connected together.

[First Embodiment]

First, in order to describe an embodiment of the invention, the mutual, positional relationships among respective parts in an optical pickup device will be described with reference to FIGS. 5 to 7. FIGS. 5, 6, and 7 are perspective views showing connection of a first flexible printed circuit fixed to the optical pickup case and a second flexible printed circuit to be inserted into a connector on a drive side.

Figure 5:
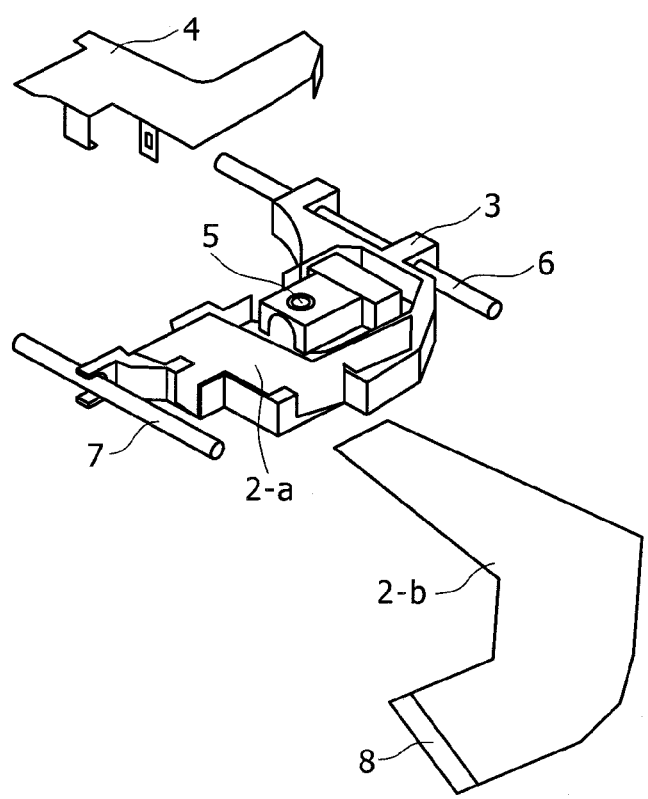
FIG. 5 is a perspective view showing a state, in which the first and second flexible printed circuits according to an embodiment of the present invention are divided at the ends thereof in the travelling direction of the optical pickup case.

FIG. 5 is a perspective view showing a state, in which the first and second flexible printed circuits are divided at the ends thereof in the travelling direction of the optical pickup case 3. As shown in FIG. 5, the first flexible printed circuit 2-*a* fixed to the optical pickup device body is mounted on a side of the object lens 5 on the optical pickup case 3. Parts of the optical pickup case 3 engage with a main shaft 6 and a sub-shaft 7 and the optical pickup case 3 reciprocates in an axial direction of the shafts, that is, a travelling direction.

The first flexible printed circuit 2-*a* fixed to the body of the optical pickup device is shown as being put in a state, in which testing is performed, that is, a state after the process of adjusting a light-emitting element, a photodetector, and various optical parts of the optical pickup device is performed. In the testing, a probe pin or a connector may be used.

Figure 6:
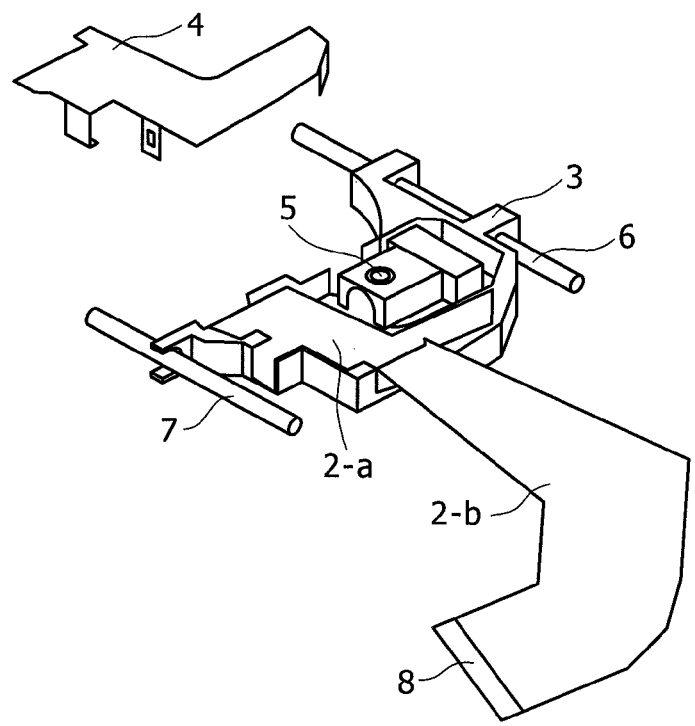
FIG. 6 is a perspective view showing a state, in which the divided first and second flexible printed circuits according to an embodiment of the present invention are connected at the ends thereof in the travelling direction of the optical pickup case.

FIG. 6 is a perspective view showing a state, in which the divided first flexible printed circuit 2-*a* and second flexible printed circuit 2-*b* are connected at the ends thereof in the travelling direction of the optical pickup case 3. As shown in FIG. 6, the second flexible printed circuit 2-b to be inserted into a connector on the drive side is positioned relative to the first flexible printed circuit 2-a fixed to the optical pickup device body and thereafter a heating head (not shown) is used to pressurize and heat connection portions of the flexible printed circuits 2-a, 2-b and they are connected with each other.

Figure 7:
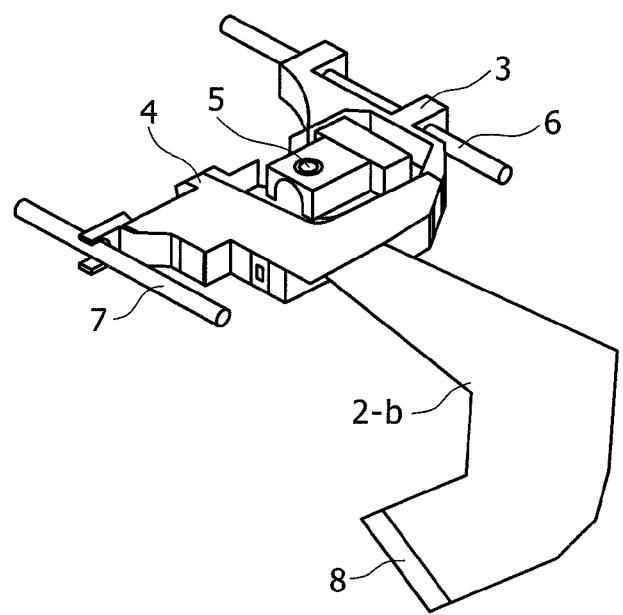
FIG. 7 is a perspective view showing a state, in which a metallic cover is mounted on the optical pickup device of FIG. 8.
Figure 8:
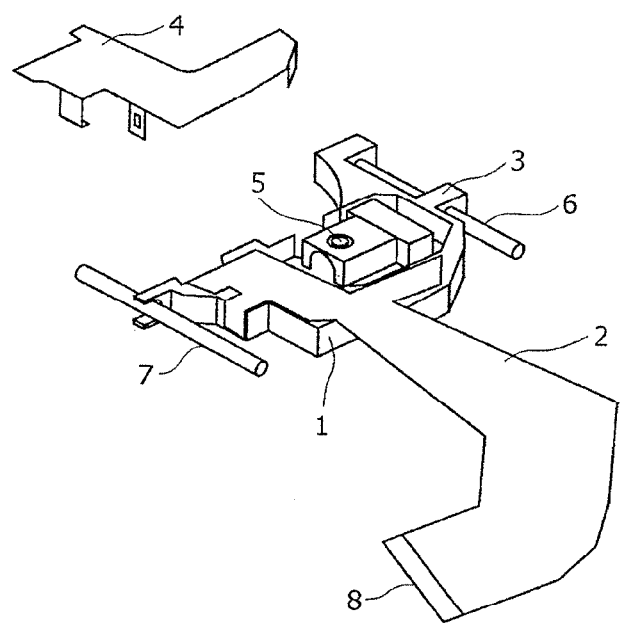
FIG. 8 is a perspective view of a thin optical pickup device according to a conventional embodiment.

FIG. 7 is a perspective view showing a state, in which a metallic cover 4 is mounted on the optical pickup device so that the flexible printed circuits 2-a, 2-b shown in FIG. 6 and connected to each other do not warp.

Subsequently, an embodiment of the invention will be described in detail with reference to a cross sectional views and plan views, which are shown in FIGS. 1 to 4.

Figure 2:
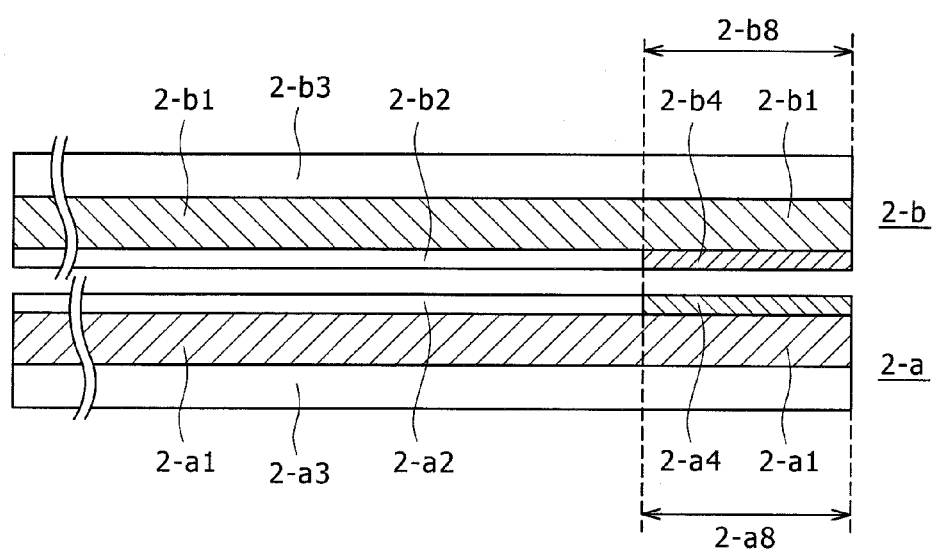
FIG. 2 is a cross sectional view of the first and second flexible printed circuits according to an embodiment of the present invention.
Figure 3A:
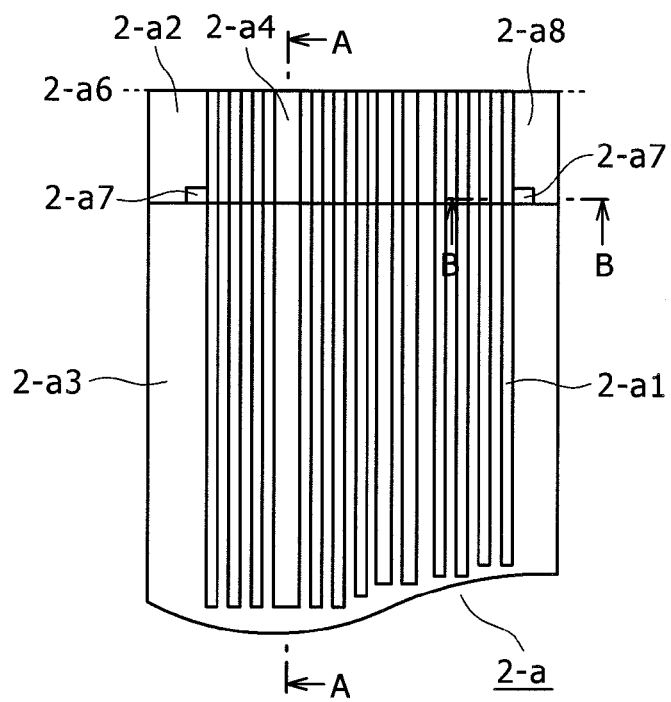
FIG. 3A is a plan view of the connection portion of the first flexible printed circuit according to an embodiment of the present invention.
Figure 3B:
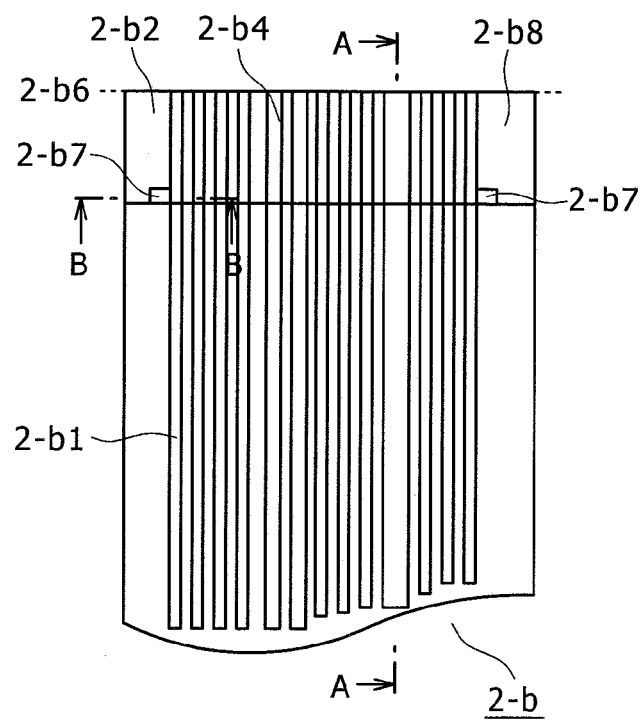
FIG. 3B is a plan view of the connection portion of the second flexible printed circuit according to an embodiment of the present invention.

FIG. 3A is a plan view showing the connection portion of the first flexible printed circuit 2-a according to this embodiment, and FIG. 3B is a plan view showing the connection portion of the second flexible printed circuit 2-b which is to be inserted into a connector on a drive side. FIG. 2 is a cross sectional view taken along line A-A in FIGS. 3A and 3B showing a state, in which the first flexible printed circuit 2-a and the second flexible printed circuit 2-b are overlapped to each other.

The first flexible printed circuit 2-a shown in FIG. 2 is structured such that a conductor pattern (wiring copper foil) 2-a1 is attached to a base film 2-a3 through an adhesive (not shown). A cover films 2-a2 is stuck to a surface of this conductor pattern 2-a1 by an adhesive (not shown) in a manner to cover the same. Those portions of the conductor pattern 2-a1, on which the cover film 2-a2 is absent, are used for mounting semiconductor chips and parts, or for connecting the second flexible printed circuit 2-b. Solder plating 2-a4 is applied to the portions to facilitate connection to the chips and the parts and a mating printed circuit. A plating thickness is desirably 5 μm to 15 μm to form a solder fillet at the time of connection.

FIG. 2 shows a state, in which a connection portion side end 2-b6 of the second flexible printed circuit 2-b to be inserted into a connector on a drive side is positioned relative to a connection portion side end 2-a6 of the first flexible printed circuit 2-a. Like the first flexible printed circuit 2-a, the second flexible printed circuit 2-b is structured such that a conductor pattern 2-b1 is attached to a base film 2-b3 through an adhesive. A cover films 2-a2 is stuck to a surface of the conductor pattern 2-b1 by an adhesive so as to cover the same. Those portions of the conductor pattern 2-b1, on which the cover film 2-a2 is absent, are used for connection to the first flexible printed circuit 2-a. Metal plating 2-b4 by nickel plating and gold plating is applied onto the conductor pattern 2a-1 so as to facilitate connection to a mating printed circuit. According to performances required at the time of and after connection, solder plating and a combination of different kinds are selected for the metal plating 2-b4 to be applied to the surface.

As shown in FIGS. 3A and 3B, connection portions 2-a8, 2-b8 are formed on the first flexible printed circuit 2-a and the second flexible printed circuit 2-b, respectively. No cover film is formed on the conductor patterns 2-a1, 2-b1 in the connection portions, but a cover film is formed in portions other than the conductor patterns. For the sake of convenience, the boundaries between the connection portions 2-a8, 2-b8 and other portions are indicated by solid lines in the FIGS. On the first flexible printed circuit 2-a, through-holes 2-a7 are formed at positions beside the outside of the outermost conductor patterns of the conductor patterns 2-a4 in the connection portions and at positions remotest from the end 2-a6 of the flexible printed circuit in the connection portion 2-a8, while on the conductor pattern 2-b4 in the connection portion of the second flexible printed circuit, projections 2-b7 of the conductor pattern are formed at positions outside the outermost conductor patterns and at positions remotest from the end 2-b6 of the connection portion 2-b8. When the two flexible printed circuits 2-a, 2-b are overlapped, the through-holes 2-a7 and the projections 2-b7 are caused to coincide.

Figure 1:
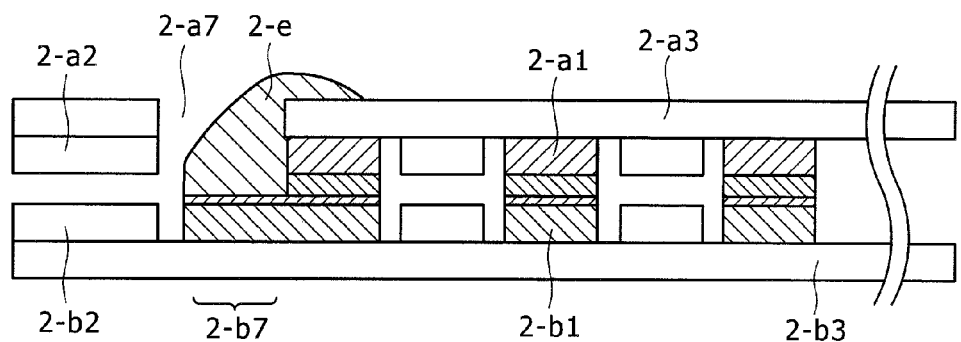
FIG. 1 is a cross sectional view of the connection portion of the first and second flexible printed circuits according to an embodiment of the present invention.

FIG. 1 is a cross sectional view taken parallel to the connection portion 2-a6 including a reinforcement after the first flexible printed circuit 2-a and the second flexible printed circuit 2-b to be inserted into a connector on the drive side are connected, and corresponds to the cross section taken along the line B-B in FIGS. 3A and 3B. The first and second flexible printed circuits oppose each other at their conductor patterns 2-a1, 2-b1; connected with each other by the solder 2-a4; and are adhered by a reinforcer 2-e as a resin member through the aforementioned through-hole 2-a7 at a position between the projection 2-b7 and the base film 2-a3 of the first flexible printed circuit. Herein, the reinforcer 2-e may be adhered only to the base film 2-a3 side, but it is more preferable that the reinforcer fills the through-hole and is also adhered to the cover film 2-a2 side.

The reinforcer 2-e may be any substance having high adhesiveness with polyimide, which is a material of the flexible printed circuits, and the conductors of the projections. Desirable examples include rubber-based, cyanoacrylate-based, polyurethane, silicone, modified silicone, acrylic and epoxy-based ultraviolet curable adhesives and thermosetting adhesives, among others.

Figure 9A:
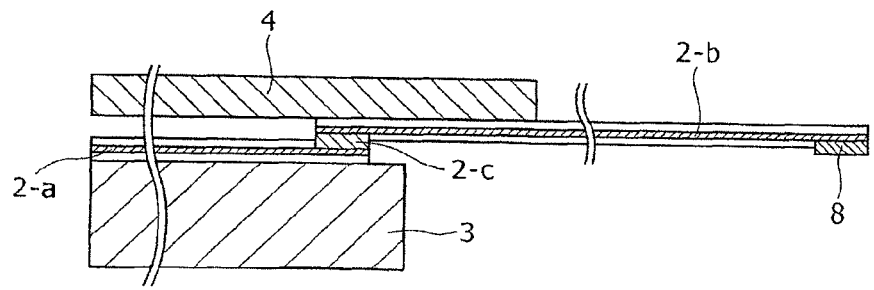
FIG. 9A is a cross sectional view of the connection portion of the first and second flexible printed circuits according to a conventional embodiment.
Figure 9B:
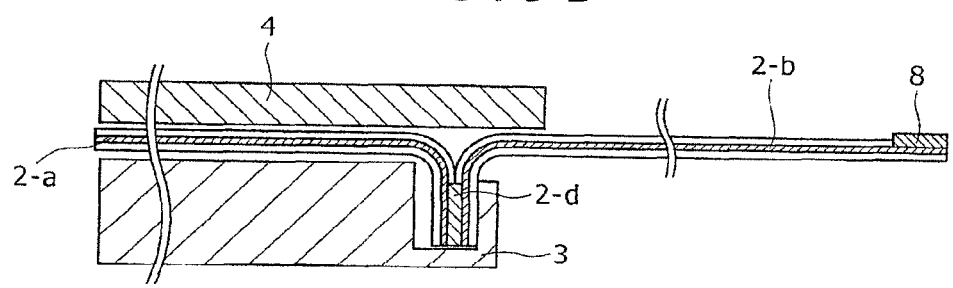
FIG. 9B is a cross sectional view of the connection portion of the first and second flexible printed circuits according to an embodiment of the present invention.
Figure 10:
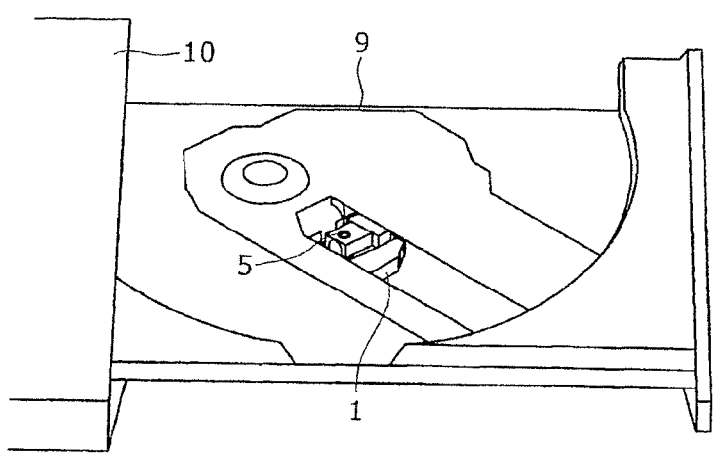
FIG. 10 is a perspective view showing a state, in which a thin optical pickup device is integrated into an optical disk drive device.

The effects of the connection structure of the present invention will be now described. When the connection portion 2-a8 of the first flexible printed circuit and the connection portion 2-b8 of the second flexible printed circuit are connected together, connection is accomplished as shown in FIG. 9B. When the second flexible printed circuit 2-b is pulled, stress acts in a direction, in which the connection portion 2-d is peeled off. At this time, a largest stress acts on that side (a lower side in FIGS. 3A and 3B) of a connector portion (equipment connection portion) of the connection portion in a length direction of the conductor patterns on the flexible printed circuits. A large stress is liable to act widthwise on an either outermost conductor pattern on the left and the right of the flexible printed circuits, and generation of peeling is liable to begin on those portions, on which stress is applied. Also, when peeling begins and solder cracks, the crack enlarges to make peeling liable to proceed. That is, a large stress acts on those portions, on which the through-hole 2-a7 and the projection 2-b7 are provided, and from which peeling is liable to occur.

In this embodiment, the through-hole 2-a7 and the projection 2-b7 are provided at a position beside the immediate outside of the outermost conductor pattern portion which is the most prone to stress and on the side closest to the equipment connection portion in the connection portion, and the outside of the solder connection portion between and the first flexible printed circuit and the second flexible printed circuit is adhered by a reinforcer, whereby peel strength can be improved. Since the reinforcer 2-e is made of a resin, its modulus of elasticity is lower than that of the connection portion of the outermost conductor pattern by the solder plating 2-a4, which mitigates the stress exerted on the connection portion.

Herein, a desirable reinforcer is that having high adhesion to metals constituting the conductor pattern 2-b4, cover film 2-a2 and base 2-a3. A resin adhesive constituting the reinforcer generally has higher adhesion to metals constituting the conductor patterns rather than to resins constituting the base films and cover films. Accordingly, by providing a metal layer on the base 2-b3 and adhering the reinforcer 2-e onto this metal layer, the adhesion of the reinforcer 2-e to the second flexible printed circuit 2-b can be increased. If this metal layer is made from the same material as the conductor pattern 2-b4 and made as the same layer, as the conductor pattern 2-b4, they can be formed together in the step of forming the conductor pattern 2-b4 on the base film 2-b, thereby lowering production costs. If the projection 2-b7 is formed integrally with the conductor patterns, the peeling of the projection 2-b7 off from the base film 2-b3 due to peeling stress can be also suppressed.

By positioning the projection 2-b7 and through-hole 2-a7 immediately next to the conductor patterns, the reinforcer is adhered to metals such as the first flexible printed circuit conductor pattern 2-a1 and solder 2-a4, leading to improved adhesion.

The projection 2-b7 and through-hole 2-a7 can be positioned to the equipment connection portion side (from the center) in the longitudinal direction of the flexible printed circuit so that the reinforcement 2-e is more likely to receive the stress on the connection portion. Herein, the projection 2-a7 may be positioned to the equipment connection portion side from the solder connection portion in the connection portion, and the projection 2-b7 may be disposed to the equipment connection portion side so that it is partially covered by the cover film on the equipment connection portion side.

Meanwhile on the first flexible printed circuit 2-a side, the reinforcer 2-e is directly adhered to the base film 2-a3 on the side opposite to the cover film 2-a5 through the through-hole 2-a7. Providing a metal layer also on this adhesion portion would increase adhesion, but it also increases the number of processes only to provide a metal layer on the surface with no conductor pattern, leading to increased production costs. However, the direction of adhesion between the reinforcer 2-e and the base film 2-a3 is opposite to the direction in which the peeling stress is exerted on the connection portion, and the adhesion acts in the direction in which the reinforcer 2-e and the base film 2-a5 are pressed against each other due to the stress, and therefore no problem is caused even if the adhesion is relatively low.

Since the base film 2-a3 and the base film 2-b3 are adhered by the reinforcer in such a manner, peeling of the outermost conductor pattern from the base film 2-a3 due to peeling stress is suppressed.

Figure 4:
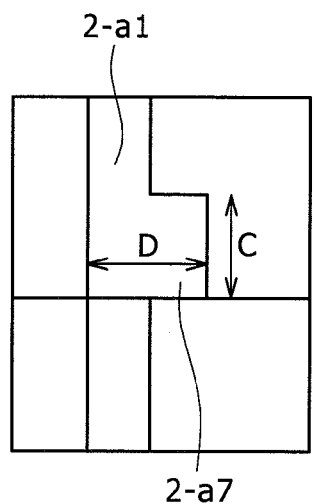
FIG. 4 is a plan view of a projection of the second flexible printed circuit according to an embodiment of the present invention.

FIG. 4 is an enlarged plan view of the projection 2-b7 on the second flexible printed circuit.

Signal lines, which have smaller width of conductor patterns than power source wires and the like, tend to be disposed to one side of the flexible printed circuit, and a conductor pattern with a conductor pattern width of 100 μm or less is sometimes disposed outermost. In order to sufficiently improve the mechanical strength of the connection portion, a projection width C (including the conductor pattern) of the projection 2-a7 of the second flexible printed circuit is desirably C>100/μm. Likewise, the projection length D of the projection 2-a7 is desirably D>100 μm. The through-hole 2-a7 having the same size is desirable.

As mentioned above, when the structure of the invention is adopted, it is possible in the optical pickup to reinforce the connection portion of the outermost conductor patterns in connecting the flexible printed circuits, and achieve resistance to pulling and bending and an improvement in reliability and durability.

The method for connecting the first and second flexible printed circuits according to this embodiment will be described. Connection is performed by solder jointing and production of a reinforcer, in the order stated.

First, the first flexible printed circuit 2-a and the second flexible printed circuit 2-b are mounted on a positioning jig, and connection portions 2-a8, 2-b8 (in particular, conductor patterns 2-a1, 2-b1) of the printed circuits are positioned so that they are overlapped to each other as shown in FIG. 2. By placing a heating head on a solder 2-a4 to heat-melt the solder, the conductor pattern 2-a1 and the conductor pattern 2-b1 are soldered.

At this time, there has been the problem that it is difficult to position the conductor patterns of the second flexible printed circuit 2-b to be inserted into a connector on the drive side with respect to the first flexible printed circuit 2-a when they are overlapped to each other. In this embodiment, the through-hole 2-a7 and the projection 2-b7 are provided, which only need to be aligned with each other, and therefore the alignment of the flexible printed circuits is facilitated.

Furthermore, there has been the problem that it is difficult to determine the boundaries between the conductor patterns and the cover lay and position a heating head since the heating head is positioned from the back side of the flexible printed circuit when the second flexible printed circuit 2-b to be inserted into a connector on the drive side is positioned with respect to the first flexible printed circuit 2-a and heat-melted. In this embodiment, by providing the through-hole 2-a7 and the projection 2-b7, easy-to-see alignment targets are provided, which facilitates the alignment of the heating head.

After the conductor patterns of the two flexible printed circuits 2-a, 2-b are joined by soldering, the reinforcer 2-e is produced by providing an adhesive material which serves as the reinforcer 2-e between the two flexible printed circuits and on the first flexible printed circuit through the through-hole 2-a7 and curing the same. Although the adhesive has to be provided after heat melting of the solder, it can be provided between the flexible printed circuits through the through-hole after the flexible printed circuits are joined, allowing easy providing of the adhesive.

[Second Embodiment]

Figure 11A:
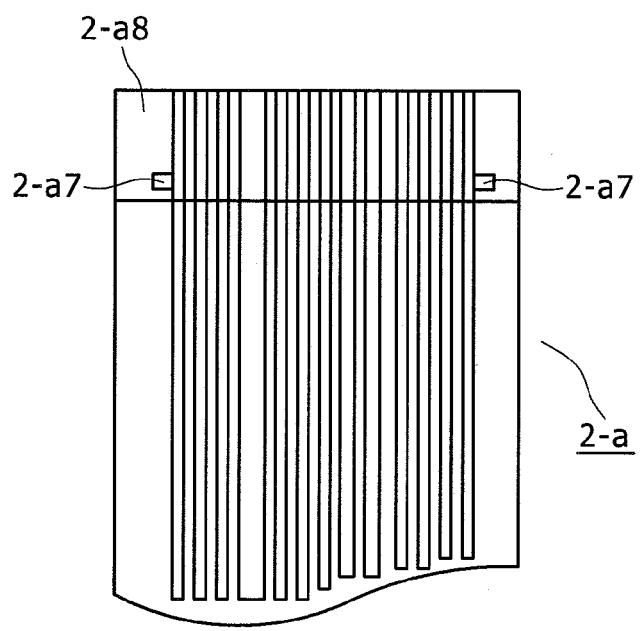
FIG. 11A is a plan view of the connection portion of a first flexible printed circuit according to another embodiment of the present invention.
Figure 11B:
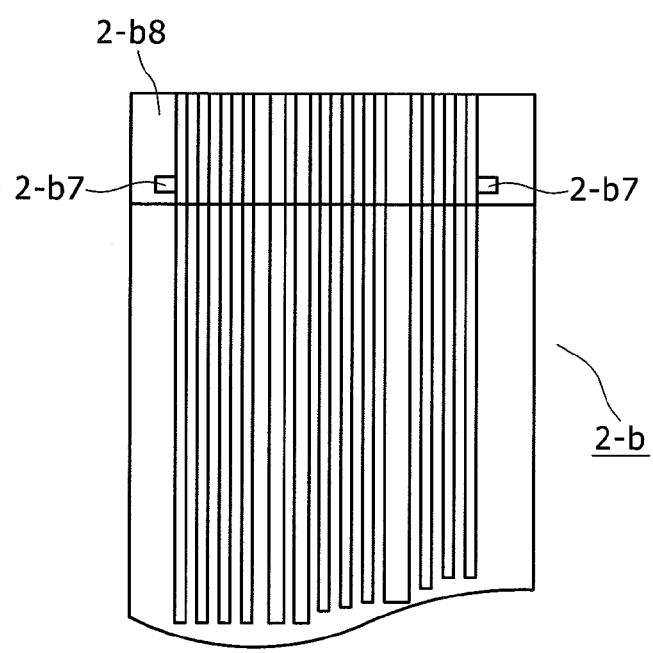
FIG. 11B is a plan view of the connection portion of a second flexible printed circuit according to another embodiment of the present invention.

FIG. 11A is a plan view of the connection portion of the first flexible printed circuit 2-a according to the second embodiment, and FIG. 11B is a plan view of the connection portion of the second flexible printed circuit 2-b to be inserted into a connector on the drive side. In this embodiment, the through-hole 2-a7 of the first flexible printed circuit and the projection 2-b7 of the second flexible printed circuit are provided to the equipment connection portion side from the center of the connection portion in the longitudinal direction of the connection portion of the flexible printed circuits. Other points are the same as in the first embodiment.

As in this embodiment, even when the through-hole 2-a7 and the projection 2-b7 are not disposed at positions closest to the equipment connection portion side in the connection portion, the reinforcer 2-e sufficiently demonstrates its function, and contributes to the improvement in the reliability and durability of the connection portion of the flexible printed circuits.

[Third Embodiment]

Figure 12A:
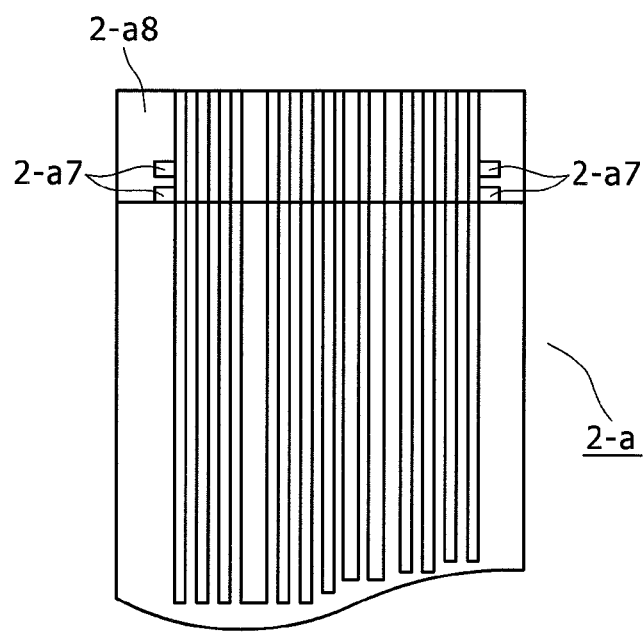
FIG. 12A is a plan view of the connection portion of a first flexible printed circuit according to another embodiment of the present invention.
Figure 12B:
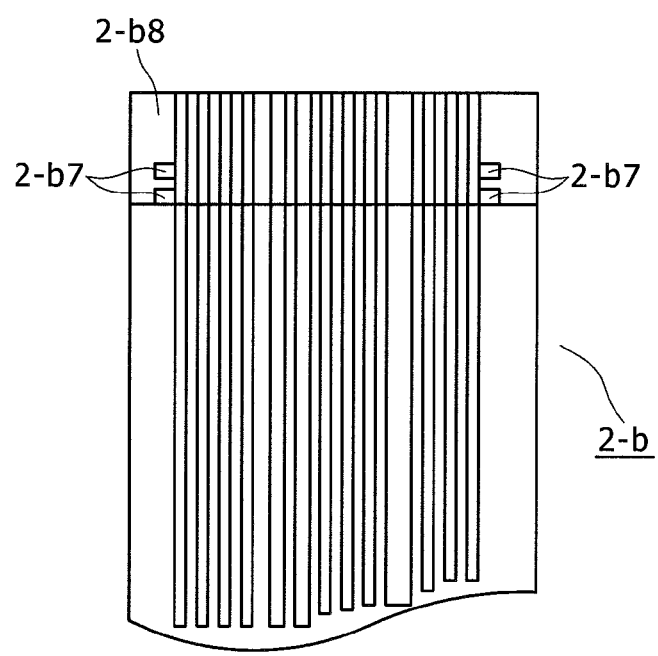
FIG. 12B is a plan view of the connection portion of a second flexible printed circuit according to another embodiment of the present invention.

FIG. 12A is a plan view of the connection portion of the first flexible printed circuit 2-a according to the third embodiment, and FIG. 12B is a plan view of the connection portion of the second flexible printed circuit 2-b to be inserted into a connector on the drive side. In this embodiment, a plurality of the through-holes 2-a7 of the first flexible printed circuit and the projections 2-b7 of the second flexible printed circuit are provided side by side in the longitudinal direction of the flexible printed circuits. Other points are the same as in the first embodiment.

Increasing the amount of the reinforcer 2-*e* further improves the reliability and durability of the connection portion. As in this embodiment, it is possible to arrange not only one but also a plurality of through-holes 2*a*-7 and projections 2-*b*7 on each side of each group of conductor patterns. In this case, connection strength is further improved than in the first embodiment.

It should be noted that the positions to provide the through-hole 2-*a*7 and the projection 2-*b*7 are not limited to those in this embodiment, but they may be, for example, between a plurality of conductor patterns as long as the conductor patterns do not short-circuit. In addition, as long as the through-hole 2-*a*7 does not electrically isolate the conductor patterns of the first flexible printed circuit, the reinforcer may be adhered onto the conductor patterns without providing a projection on the conductor patterns of the second flexible printed circuit.

[Fourth Embodiment]

Figure 13A:
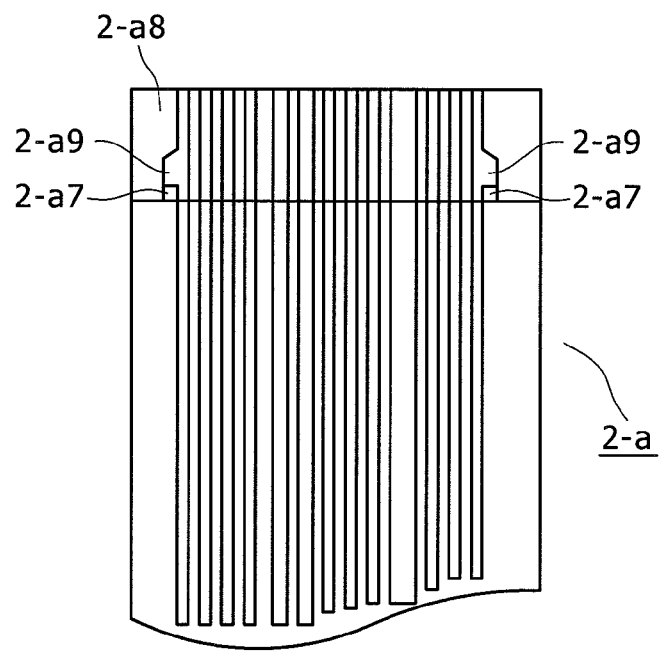
FIG. 13A is a plan view of the connection portion of a first flexible printed circuit according to another embodiment of the present invention.
Figure 13B:
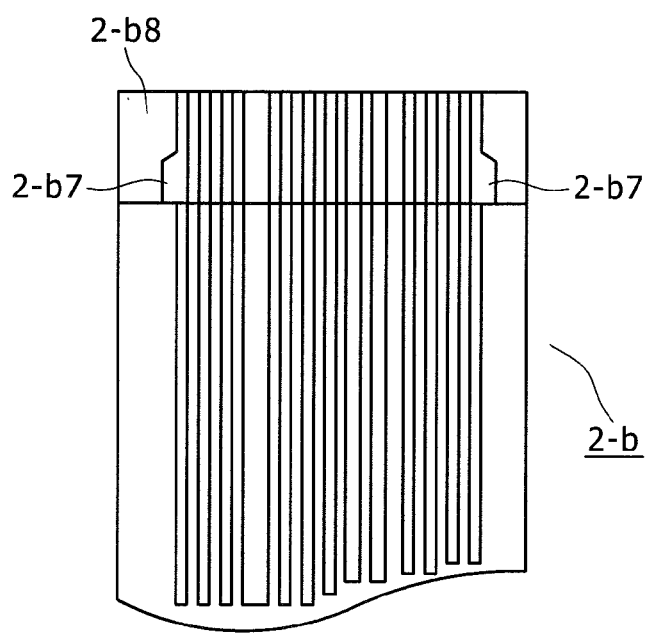
FIG. 13B is a plan view of the connection portion of a second flexible printed circuit according to another embodiment of the present invention.

FIG. 13A is a plan view of the connection portion of the first flexible printed circuit 2-*a*, and FIG. 13B is a plan view of the connection portion of the second flexible printed circuit 2-*b* to be inserted into a connector on the drive side according to the fourth embodiment. In this embodiment, the first flexible printed circuit also has a projection 2-*a*9 with a larger wiring width than other portions, and has through-holes 2-*a*7 on the equipment connection portion side of the projection 2-*a*9. The projections 2*b*-7 of the second flexible printed circuit is joined to the projection 2-*a*9 by soldering as well as the conductor patterns, and is connected to the through-hole 2-*a*7 by the reinforcing member 2-*e*. Other points are the same as in the first embodiment.

According to this embodiment, in addition to the effect of the reinforcing member 2-*e* in improving the strength of the connection portion due to the through-hole 2-*a*7 and the reinforcing member 2-*e*, the effect of soldering in improving joining strength of the connection portion by soldering the projection 2*b*-7 and the projection 2-*a*9 is also obtained.

[Fifth Embodiment]

Figure 14A:
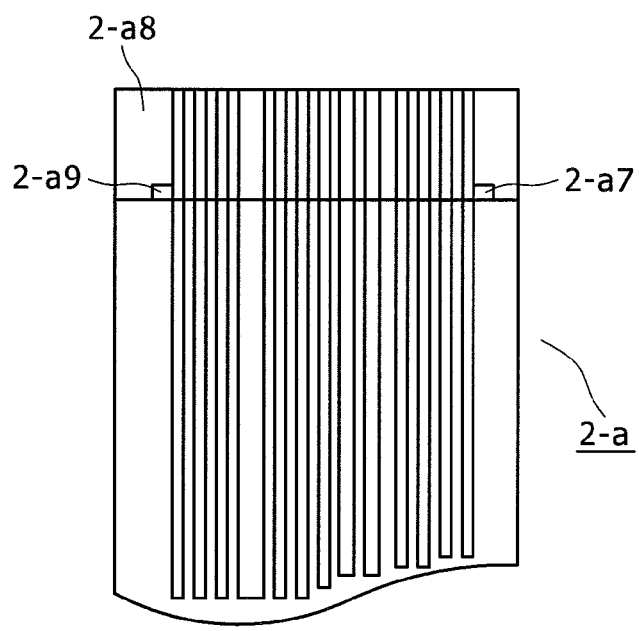
FIG. 14A is a plan view of the connection portion of a first flexible printed circuit according to another embodiment of the present invention.
Figure 14B:
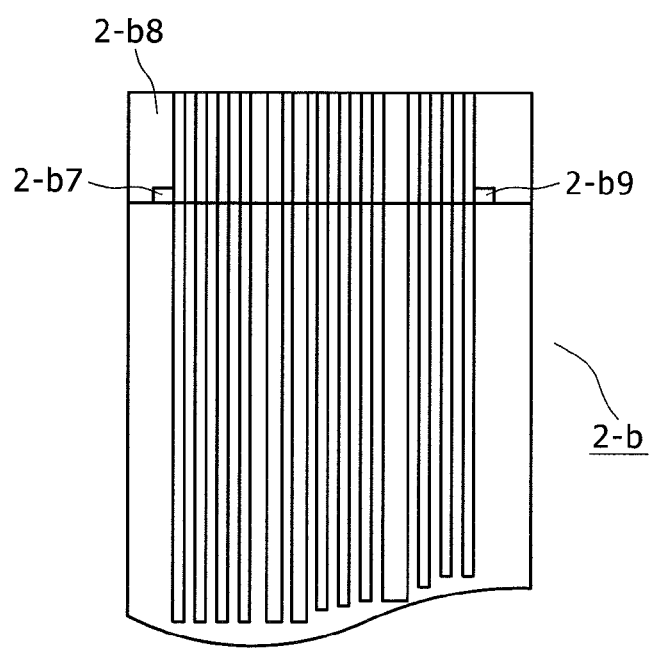
FIG. 14B is a plan view of the connection portion of a second flexible printed circuit according to another embodiment of the present invention.

FIG. 14A is a plan view of the connection portion of the first flexible printed circuit 2-*a* according to the fifth embodiment, and FIG. 14B is a plan view of the connection portion of the second flexible printed circuit 2-*b* to be inserted into a connector on the drive side. In this embodiment, the first and second flexible printed circuits have a through-hole and a projection, respectively. When the flexible printed circuits are overlapped to each other, the through-hole 2-*a*7 of the first flexible printed circuit and the projection 2-*b*7 of the second flexible printed circuit are overlapped to each other, while the projection 2-*a*9 of the first flexible printed circuit and the through-hole 2-*b*9 of the second flexible printed circuit are overlapped to each other. the reinforcer 2-*e* is formed in a portion where the through-hole and the projection are overlapped as in the other embodiments. Other points are the same as in the first embodiment. This also provides the same effects as those of the first embodiment 1. In this embodiment, the form of the connection portion can be made similarly with the first and second flexible printed circuits.

Although the first to fifth embodiments have been described above, in any embodiment, the configuration of the projection placed on the outermost conductor pattern in the connection portion of the flexible printed circuit may be a triangle, sector, trapezoid or another shape as long as it is so structured that the other end of the conductor pattern is 100 µm or more.

Increasingly sophisticated optical pickup devices are currently required, which include those with reduced thickness and the ability to reproduce and record from/into not only CDs but also DVDs according to various standards. Furthermore, in order to reproduce and record images from/into next-generation disks in the future, three wavelength compatible thin optical pickup devices with blue semiconductor lasers integrated therein will be required.

It is therefore expected that flexible printed circuits used in optical pickup devices will be required to have higher density and multilayer structures, and their costs will be greatly increased. A solution to this is to divide a flexible printed circuit, which is originally an integral component, and connect the flexible printed circuits, and fixing and protecting the connection portion are necessary at this time. the present invention is a technique relating to the connection of flexible printed circuits together, which can achieve an improvement in yield and cost reduction.

What is claimed is:

1. A connection structure of flexible printed circuits comprising:
   first and second flexible printed circuits, each having a resin base, a plurality of metallic wires formed side by side on the base, and a resin cover covering the wires of the side of opposite to the base; and
   a connection portion in which the plurality of wires of the first flexible printed circuit and the plurality of wires of the second flexible printed circuit are connected to each other in portions which are not covered with the cover,
   wherein: the first flexible printed circuit and the second flexible printed circuit each have a first surface to which the other flexible printed circuit is connected, and a second surface opposite to the first surface;
   the first flexible printed circuit has a throughhole; and
   a resin member passes through the through-hole, and is adhered to the first surface of the second flexible printed circuit and the second surface of the first flexible printed circuit.

2. The connection structure of the flexible printed circuits according to claim 1,
   wherein the resin member is adhered to the base on the second surface of the first flexible printed circuit.

3. The connection structure of the flexible printed circuits according to claim 1 or 2,
   wherein: the second flexible printed circuit has a metal layer on the side of the first surface of the base thereof; and
   the resin member is adhered to the metal layer.

4. The connection structure of the flexible printed circuits according to claim 3,
   wherein the metal layer is formed on each of both sides of the region where the plurality of wires are formed side by side in a manner of nipping the region.

5. The connection structure of the flexible printed circuits according to claim 1,
   wherein wires and a metal layer are formed of the same material on the same layer.

6. The connection structure of the flexible printed circuits according to claim 1,
   wherein wires and a metal layer are formed integrally.

7. The connection structure of the flexible printed circuits according to claim 1,
   wherein: the wires of the first flexible printed circuit and the wires of the second flexible printed circuit are connected by solder; and
   the resin member is adhered to the solder or the wires of the second flexible printed circuit.

8. The connection structure of the flexible printed circuits according to claim 1, wherein: the first flexible printed circuit and the second flexible printed circuit each has an equipment connection portion connected to another device; and the equipment connection portions of the first flexible printed circuit and the equipment connection portion of the second flexible printed circuit are on the same side with respect to the connection portion in the longitudinal direction of the flexible printed circuits.

9. The connection structure of the flexible printed circuits according to claim 1, wherein a metal layer or the through-hole is provided to an equipment connection portion side from the center of the connection portion in the longitudinal direction of the flexible printed circuit.

10. The connection structure of the flexible printed circuits according to claim 1, wherein the connection structure has a plurality of through-holes or metal layers arranged side by side in the longitudinal direction of the flexible printed circuit.

11. The connection structure of the flexible printed circuits according to claim 1, wherein: the wires of the first flexible printed circuit and the wires of the second flexible printed circuit each has a wide portion which is wider than other portions; and the wide portion of the second flexible printed circuit is connected to the wide portion of the first flexible printed circuit by solder and is adhered to the resin member at a position located to an equipment connection portion side from the connected portion.

12. An optical pickup device comprising:

the connection structure of the flexible printed circuits according to claim 1;

an optical pickup case;

a lens;

a mirror;

a light emitting element; and a photodetector, wherein either the first flexible printed circuit or the second flexible printed circuit and the connection portion are disposed within the pickup case.

13. A method for producing a connection structure of flexible printed circuits including:

first and second flexible printed circuits each having a resin base, a plurality of metallic wires formed side by side on the base, and a resin cover which covers the wires of the side opposite to the base; and a connection portion in which the plurality of wires of the first flexible printed circuit and the plurality of wires of the second flexible printed circuit are connected to each other in portions which are not covered with the cover, the first flexible printed circuit having a throughhole, the method comprising the steps of:

connecting the wires between to the first flexible printed circuit and the second flexible printed circuit by soldering; and adhering the first flexible printed circuit and the second flexible printed circuit by providing a resin member through the through-hole after the soldering.

14. The method for producing the connection structure of the flexible printed circuits according to claim 13, wherein: the first flexible printed circuit and the second flexible printed circuit each has a first surface to which the other flexible printed circuit is connected, and a second surface opposite to the first surface; and the resin member passes through the through-hole and is adhered to the first surface of the second flexible printed circuit and the second surface of the first flexible printed circuit.

15. The connection structure of the flexible printed circuits according to claim 1, wherein the first flexible printed circuit has a base film disposed on the first surface of the first flexible printed circuit board, wherein the resin member is adhered to the circuit from an upper area of the base film of the first surface of the first flexible circuit board.

* * * * *